United States Patent
Minami

(10) Patent No.: US 9,793,215 B2
(45) Date of Patent: Oct. 17, 2017

(54) SEMICONDUCTOR INTEGRATED CIRCUIT DEVICE

(71) Applicant: SII Semiconductor Corporation, Chiba-shi, Chiba (JP)

(72) Inventor: Yukimasa Minami, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/138,338

(22) Filed: Apr. 26, 2016

(65) Prior Publication Data

US 2016/0322301 A1 Nov. 3, 2016

(30) Foreign Application Priority Data

May 1, 2015 (JP) ................. 2015-094311

(51) Int. Cl.
*H01L 23/525* (2006.01)
*H01L 23/532* (2006.01)
*H01L 29/06* (2006.01)

(52) U.S. Cl.
CPC .... *H01L 23/53295* (2013.01); *H01L 23/5258* (2013.01); *H01L 29/0649* (2013.01); *H01L 23/53271* (2013.01)

(58) Field of Classification Search
CPC ........... H01L 23/53295; H01L 23/5258; H01L 29/0649; H01L 23/53271
See application file for complete search history.

(56) References Cited

U.S. PATENT DOCUMENTS

| | | | | |
|---|---|---|---|---|
| 5,872,390 A * | 2/1999 | Lee | ...................... | H01L 23/5256 257/529 |
| 5,970,346 A * | 10/1999 | Liaw | ...................... | H01L 21/768 148/DIG. 55 |
| 6,541,290 B1 * | 4/2003 | Bang | ................... | H01L 23/5258 257/202 |
| 7,576,408 B2 * | 8/2009 | Byun | ................... | G11C 17/143 257/209 |
| 2004/0245600 A1 * | 12/2004 | Kamiya | .............. | H01L 23/5258 257/529 |
| 2016/0276270 A1 * | 9/2016 | Iwasaki | ............... | H01L 23/5256 |

OTHER PUBLICATIONS

Abstract, Publication No. JP 2010-056557, Publication date Nov. 3, 2010.

* cited by examiner

*Primary Examiner* — Jarrett Stark
(74) *Attorney, Agent, or Firm* — Adams & Wilks

(57) ABSTRACT

A semiconductor integratd circuit device includes fuse elements formed on an element isolation insulating film, and an insulating film, an interlayer insulating film and a silicon nitride film successively formed over the fuse elements. An opening region extends through the silicon nitride film into the interlayer insulating film above the fuse elements, and openings formed in the interlayer insulating film are positioned on both sides of middle portions of the fuse elements. The openings facilitate blowing off of the insulating film during laser cutting of the fuse elements, reducing physical damage to the element isolation insulating film under the fuse elements.

2 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device including a fuse element.

2. Description of the Related Art

In a semiconductor integrated circuit device manufacturing process there is a method of setting elements for circuit configuration by cutting a fuse element formed of polysilicon, metal, and the like by using, for example, a laser after a wafer manufacturing process is finished. With the use of this method, a resistance value can be corrected to obtain desired characteristics after electrical characteristics of the semiconductor device are measured. The method is thus effective particularly for a semiconductor device that places emphasis on its analog characteristics.

A conventional semiconductor integrated circuit device is illustrated in FIG. 5 and FIG. 6. FIG. 5 is a plan view of fuse elements 103, and FIG. 6 is a sectional view taken along the line A-A? of FIG. 5. As illustrated in FIG. 6, the fuse elements 103 are formed on an element isolation insulating film 102, and are formed of a polycrystalline Si film doped with impurities, which is the same conductive material as that of a gate electrode (not shown) of a MOS transistor.

Further, an opening region 108 that is used for cutting middle portions of the fuse elements 103 with a laser is formed above the fuse elements 103. The opening region 108 is hitherto formed by selectively etching an interlayer insulating film 105 formed for the purpose of metal lamination and a silicon nitride film 106 formed for the purpose of protecting an internal element from moisture coming in from the outside respectively using a mask. At that time, the insulating film on the fuse element 103 should be adjusted to have a thickness in a certain range, taking into consideration variations that occur in a process such as deposition or etching of the insulating film and variations in laser intensity during cutting of the fuse elements 103. The reason is that, if a fuse element 103 is exposed, the fuse element 103 expands under the influence of the moisture and a crack may develop along an interface between the exposed fuse element 103 and a fuse element 103 covered with the insulating film, which may adversely affect the internal element. Meanwhile, when the fuse element 103 is cut with a laser, it is necessary to blow off the insulating film simultaneously with the fuse element 103. At this time, if the insulating film on the fuse element 103 is too thick, the insulating film on the fuse element 103 is not blown off so easily, and thermal energy for the blowing off is transferred to the element isolation insulating film 102 under the fuse element 103 to physically damage the element isolation insulating film 102, which results in generation of a crack. If a residue of the scattered fuse element 103 enters the crack, the residue and a silicon substrate 101 may be electrically connected to each other, leading to abnormal electrical characteristics.

In order to deal with the problem described above, various devices for alleviating damage to a base film have been made that includes measurement and strict control of a film thickness of a fuse opening, increasing the thickness of the insulating film under the fuse element 103 with respect to other element isolating film thicknesses, and laying a damage block material on the base film (for example, Japanese Patent Application Laid-open No. 2010-056557).

However, when the thickness of the insulating film 102 under the fuse element 103 is increased with respect to other element isolating film thicknesses or a material for blocking damage is laid on the base film, there is apprehension that the level difference between the silicon substrate 101 and the element isolation insulating film 102 may be increased. Therefore, the aspect ratio of a contact of an element formed on the silicon substrate 101 becomes very high, and there is a possibility that the contact is not formed or electrical connection is made that exhibits an unusually high contact resistance value. Meanwhile, even if the contact of the element formed on the silicon substrate 101 is electrically connected, a contact to the fuse element 103 may pierce the film of the fuse element 103 to cause a quality abnormality.

SUMMARY OF THE INVENTION

It is an object of the present invention to provide a semiconductor integrated circuit device that enables stable cutting of a fuse without the apprehension described above and without causing abnormal quality when the fuse is cut.

In order to solve the above-mentioned problem, the following means is taken in one embodiment of the present invention.

First, provided is a semiconductor integrated circuit device, including:

a semiconductor substrate;

an element isolation insulating film formed on a surface of the semiconductor substrate;

a plurality of fuse elements, each of which is formed of first polycrystalline silicon, and are arranged on the element isolation insulating film at intervals;

an insulating film formed on the plurality of fuse elements;

an interlayer insulating film formed on the insulating film;

a silicon nitride film formed on the interlayer insulating film;

an opening region formed above the plurality of fuse elements, the opening region being formed by removing part of the silicon nitride film and part of the interlayer insulating film; and concaves formed by removing a remaining portion of the interlayer insulating film under the opening region, the concaves being formed in the vicinity of both sides of each of fuse middle portions of the plurality of fuse elements at regular intervals.

Further, in the semiconductor integrated circuit device, the concaves formed in the vicinity of both sides of each of the fuse middle portions of the plurality of fuse elements at regular intervals have slit-like shapes.

Further, in the semiconductor integrated circuit device, the concaves formed in the vicinity of both sides of each of the fuse middle portions of the plurality of fuse elements at regular intervals have small square shapes.

Further, in the semiconductor integrated circuit device, the number of the concaves formed in the vicinity of both sides of each of the fuse middle portions of the plurality of fuse elements at regular intervals is one between adjacent fuse elements.

According to the present invention, even when the thickness of the insulating film on the fuse elements is set to be large, the slit-like concaves are formed in the vicinity of both sides of each of the fuse middle portions of the fuse elements at regular intervals, and thus, the insulating film can be blown off more easily when cut with a laser. As a result, physical damage to the element isolation insulating film under the fuse elements can be reduced to prevent electrical connection with the semiconductor substrate.

DETAILED DESCRIPTION OF THE INVENTION

Embodiments of the present invention are described below with reference to the attached drawings.

Figure 1:
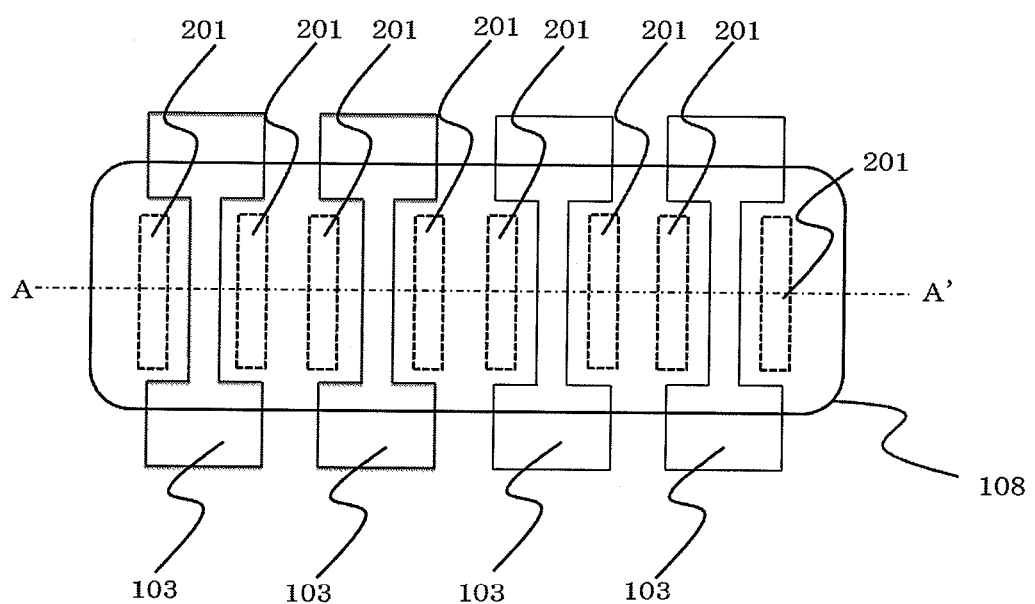
FIG. 1 is a schematic plan view of a semiconductor integrated circuit device according to a first embodiment of the present invention.
Figure 2:
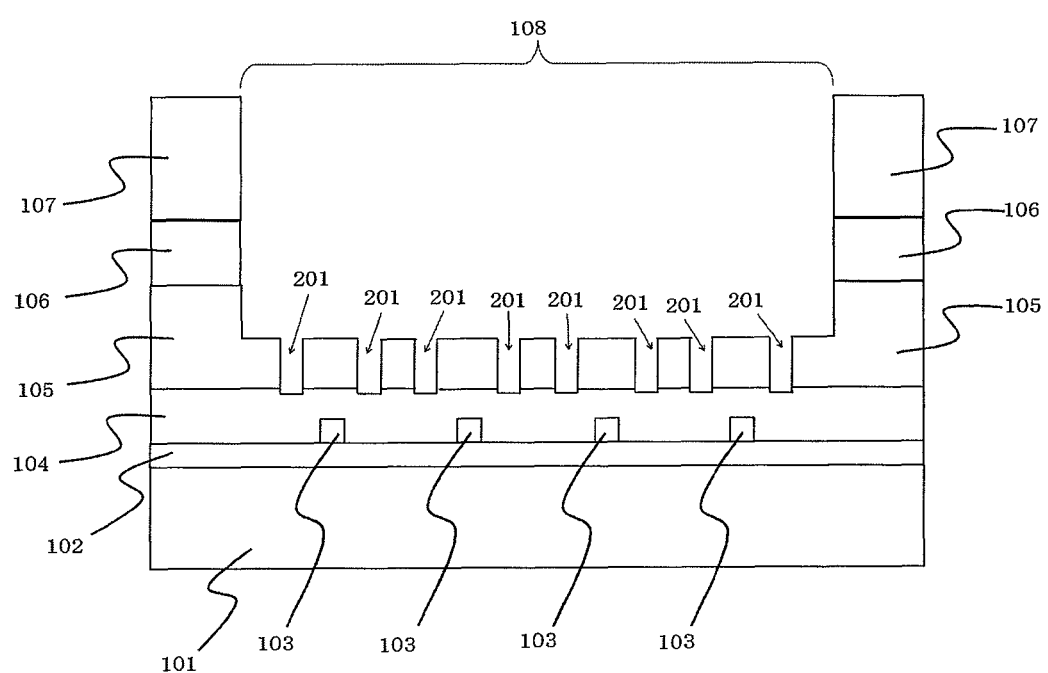
FIG. 2 is a schematic sectional view of the semiconductor integrated circuit device taken along the line A-A' of FIG. 1.

FIG. 1 is a schematic plan view of a semiconductor integrated circuit device according to a first embodiment of the present invention. FIG. 2 is a schematic sectional view of the semiconductor integrated circuit device according to the first embodiment of the present invention taken along the line A-A? of FIG. 1. First, a structure of a fuse region in plan view is described with reference to FIG. 1. A plurality of fuse elements 103 are arranged in spaced-apart side-by-side relationship on a surface of an element isolation insulating film formed on a silicon semiconductor substrate. A fuse middle portion of the fuse element 103 is thinner than both end portions thereof so as to be easily cut with a laser. Slit-like openings such as concaves 201 are formed in the vicinity of both sides of each of fuse middle portions of the fuse elements 103 at regular intervals. Further, an opening region 108 in which a polyimide 107, a silicon nitride film 106 serving as a protective film, and an interlayer insulating film 105 are etched partway for the purpose of cutting with a laser is formed above the middle portions of the plurality of fuse elements 103 as shown in FIG. 2. Therefore, the concaves 201 are formed so as to be exposed at the bottom of the fuse opening region 108. The present invention has a feature in that the slit-like concaves 201 are formed so as to be adjacent to the fuse elements 103, respectively, in the interlayer insulating film 105 above the fuse element 103. In this embodiment, the slit-like concaves 201 are rectangular in plan view.

FIG. 2 is a schematic sectional view of the semiconductor device taken along the line A-A' of FIG. 1. The element isolation insulating film 102 at a thickness of from 4,000 Å to 7,000 Å, for example, is formed on the silicon semiconductor substrate 101. The fuse elements 103 on the element isolation insulating film 102 are formed of a polycrystalline Si film doped with impurities that is the same layer and the same conductive material as those of a gate electrode (not shown) of a MOS transistor. The fuse elements 103 have a thickness of from about 2,000 Å to about 4,000 Å. An insulating film 104 for insulating an element formed on the silicon substrate 101 and metal wiring from each other, for example, a BPSG film is formed on the fuse elements 103, and the metal wiring and the interlayer insulating film 105 for the purpose of metal wiring lamination are formed on the insulating film 104. Further, the silicon nitride film 106 is laminated for the purpose of protecting an internal element from moisture coming in from the outside. Finally, the polyimide 107 for alleviating stress on a package is laminated, and after that, the opening region 108 is formed in the polyimide 107. Then, part of the silicon nitride film 106 and part of the interlayer insulating film 105 are etched subsequently with the remaining polyimide 107 itself being used as a mask, thereby forming the opening region 108. Then, another mask is used for patterning and the rest of the interlayer insulating film 105 is etched to form the slit-like concaves 201: At this time, etching selectivity between the interlayer insulating film 105 and the insulating film 104 thereunder is small, and thus, it is difficult to stop the etching at an interface therebetween. The insulating film 104 may be etched to some extent.

With such a structure, the slit-like concaves 201 are on both sides of each of the fuse elements 103, and adjacent concaves 201 of adjacent fuse elements 103 are spaced apart and separated from one another. Thus the interlayer insulating film 105 is separated along the fuse elements 103, which facilitates blowoff of the interlayer insulating film 105 when laser light is radiated even when the interlayer insulating film 105 above the fuse elements 103 is thick. Therefore, even when the interlayer insulating film 105 above the fuse elements 103 is thick, it is not necessary to increase the output of the laser, and physical damage to the element isolation insulating film 102 under the fuse elements 103 can be reduced. In this embodiment, the concaves are rectangular in plan view, but it goes without saying that the concaves may be polygonal or oval.

Figure 3:
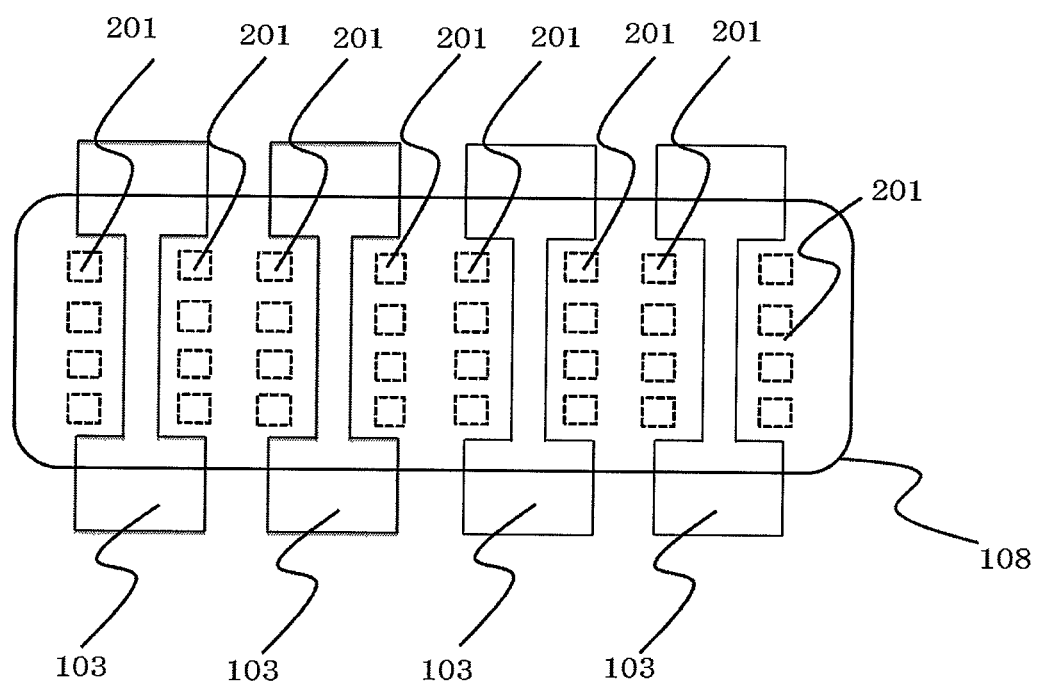
FIG. 3 is a schematic plan view of a semiconductor integrated circuit device according to a second embodiment of the present invention.

FIG. 3 is a schematic plan view of a semiconductor integrated circuit device according to a second embodiment of the present invention. While the concaves (openings) 201 are rectangular slits in the first embodiment, in the second embodiment, the concaves (openings) 201 are a plurality of small square concaves 201. A plurality of square concaves 201 are on both sides of a fuse element 301, and thus, the interlayer insulating film 105 is partly separated along the fuse elements 103, which facilitates blowoff of the interlayer insulating film 105 when laser light is radiated. Note that, the small concaves may be rectangular or circular.

Figure 4:
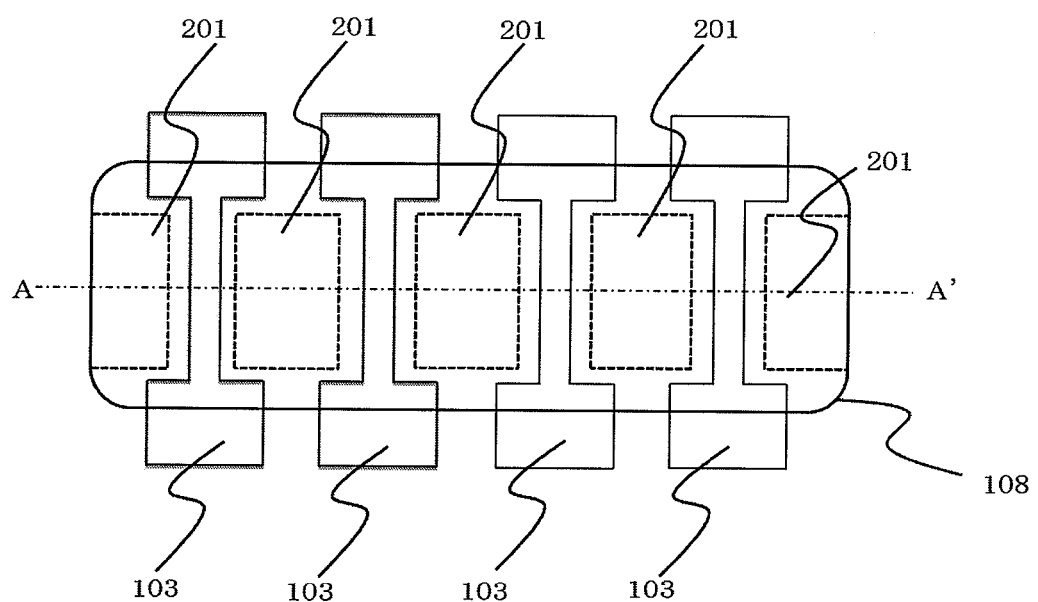
FIG. 4 is a schematic plan view of a semiconductor integrated circuit device according to a third embodiment of the present invention.
Figure 5:
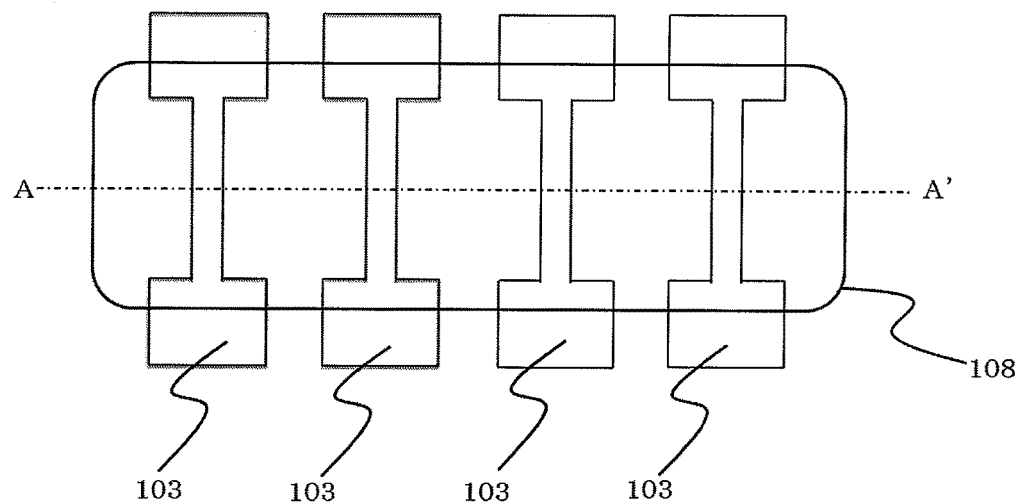
FIG. 5 is a schematic plan view of a related-art semiconductor integrated circuit device.
Figure 6:
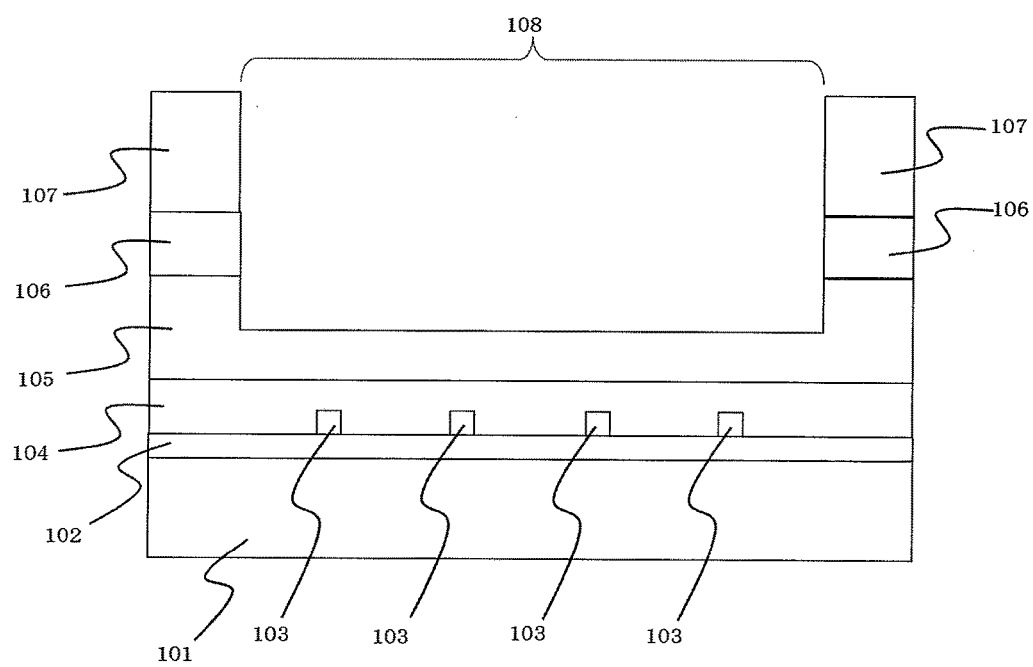
FIG. 6 is a schematic sectional view of the related-art semiconductor integrated circuit device taken along the line A-A' of FIG. 5.

FIG. 4 is a schematic plan view of a semiconductor integrated circuit device according to a third embodiment of the present invention. While two lines of concaves 201 are formed between adjacent fuse elements 103 in FIG. 1 and in FIG. 3, as illustrated in FIG. 4, one line of concave (openings) 201 may be formed between adjacent fuse elements 103. In this case, the concaves 201 can have an increased width (width in a direction of intervals of adjacent fuse elements 103), which is advantageous in that fuse cutting is further facilitated and in that the possibility is further reduced that the interlayer insulating film 105 damages the element isolation insulating film 102 under the adjacent fuse elements 103 when blown off by radiated laser light.

In the above description, part of the polyimide 107, part of the silicon nitride film 106, and part of the interlayer insulating film 105 are etched in succession using the first mask to form the opening region 108, and then, the rest of the interlayer insulating film 105 is etched using the second mask to form the concaves 201. Alternatively, the polyimide 107 and the silicon nitride film 106 may be etched in succession using the first mask to form the opening region 108, and then, the interlayer insulating film 105 may be etched using the second mask to form the concaves 201.

Forming of the concaves 201 as in the present invention facilitates blowoff of the interlayer insulating film 105, and thus, such a process can be set. Further, there is a case in which the polyimide 107 is not used, but it goes without saying that the present invention can be completely similarly applied to such a case.

As described above, even when the thickness of the insulating film 104 on the fuse elements 103 is set to be large, the concaves 201 are formed in the interlayer insulating film 105 in the vicinity of both sides of each of the fuse middle portions of the fuse elements 103 at regular intervals, and thus, the insulating film can be blown off more easily when cut with a laser. As a result, physical damage to the element isolation insulating film 102 under the fuse elements 103 can be reduced to prevent electrical connection with the silicon substrate 101.

What is claimed is:

1. A semiconductor integrated circuit device, comprising:
   a semiconductor substrate;
   an element isolation insulating film disposed on a surface of the semiconductor substrate;
   fuse elements disposed in spaced-apart side-by-side relationship on the element isolation insulating film, each fuse element having two opposite end portions interconnected by a middle portion;
   an insulating film disposed on the fuse elements;
   an interlayer insulating film disposed on the insulating film;
   a silicon nitride film disposed on the interlayer insulating film;
   an opening region extending through the silicon nitride film into the interlayer insulating film at a location above the fuse elements; and
   openings formed in the interlayer insulating film at a bottom of the opening region, the openings being positioned on both sides of the middle portions of the fuse elements, adjacent openings of adjacent fuse elements being spaced apart and separated from one another, and plural openings being positioned on each side of the middle portions of the fuse elements.

2. A semiconductor integrated circuit device according to claim 1; wherein the openings have a square shape.

* * * * *